United States Patent
Jia et al.

(10) Patent No.: US 12,136,453 B2
(45) Date of Patent: Nov. 5, 2024

(54) SYSTEMS, METHODS AND MEDIA OF OPTIMIZATION OF TEMPORARY READ ERRORS IN 3D NAND MEMORY DEVICES

(71) Applicant: Yangtze Memory Technologies Co., Ltd., Hubei (CN)

(72) Inventors: Jianquan Jia, Hubei (CN); Kaikai You, Hubei (CN); Xinlei Jia, Hubei (CN); Wen Zhou, Hubei (CN); Kun Yang, Hubei (CN); Jiayin Han, Hubei (CN); Pan Xu, Hubei (CN); Zhe Luo, Hubei (CN); Da Li, Hubei (CN); Lei Jin, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 35 days.

(21) Appl. No.: 17/879,593

(22) Filed: Aug. 2, 2022

(65) Prior Publication Data
US 2024/0046980 A1 Feb. 8, 2024

(51) Int. Cl.
*G11C 16/00* (2006.01)
*G11C 11/4074* (2006.01)
*G11C 11/4076* (2006.01)
*G11C 11/408* (2006.01)
*G11C 11/4096* (2006.01)

(52) U.S. Cl.
CPC ...... *G11C 11/4096* (2013.01); *G11C 11/4074* (2013.01); *G11C 11/4076* (2013.01); *G11C 11/4085* (2013.01)

(58) Field of Classification Search
None
See application file for complete search history.

(56) References Cited

U.S. PATENT DOCUMENTS 8,069,157 B2  11/2011  Jam
9,575,535 B2  2/2017  Wang
11,784,652 B2  10/2023  Shih

FOREIGN PATENT DOCUMENTS

CN       112506443 A  *  3/2021
TW          I762384 B      4/2022
WO  WO 2015/090194 A1     6/2015

OTHER PUBLICATIONS

Chinese Office Action directed to Chinese Patent Application No. 111149848, mailed Jan. 16, 2024; 8 pages.

* cited by examiner

*Primary Examiner* — Alfredo Bermudez Lozada
(74) *Attorney, Agent, or Firm* — Conley Rose, P.C.

(57) ABSTRACT

The present disclosure provides systems, methods and media of optimization of temporary read errors (TRE) in three-dimensional (3D) NAND memory devices. The (3D) NAND memory devices comprises a plurality of memory cells arranged as an array of NAND memory strings, a plurality of word lines couple to the memory cells, and a controller. The controller is configured to determine whether a next read operation is a first read operation of the memory device after recovering from an idle state, and in response to a positive result of the determination, control the memory device to perform an extended pre-phase of the first read operation before a read-phase of the first read operation.

20 Claims, 8 Drawing Sheets

SYSTEMS, METHODS AND MEDIA OF OPTIMIZATION OF TEMPORARY READ ERRORS IN 3D NAND MEMORY DEVICES

TECHNICAL FIELD

The present disclosure generally relates to the field of semiconductor technology, and more particularly, to systems, methods and media of optimization of temporary read errors (TRE) in three-dimensional (3D) NAND memory devices.

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells. In a 3D NAND memory device, a block can have multiple top select gates (TSGs), while word lines and bottom select gate (BSG) are shared within the block. Each memory cell in the block corresponds to a word line that acts to control the cell. Each memory cell may be associated with a data state according to write data in a program command. Based on its data state, a memory cell will either remain in the erased state or be programmed to a programmed data state. The signal that accesses the cell to either read or write data is applied to the word line and the bit line perpendicular to the word line.

Generally, a read operation in the 3D NAND memory architecture begins with a row address being input to the row decoder. After buffering the address, the row decoder decides which word line to be selected. All of the memory cells connected to that selected word line output a programmable output voltage to their respective bit lines that represent a stored 0 or 1 logic state. The sense amplifiers amplify the change in bit line voltage to a full logic level. The data from the cells, which are on the selected word line, is first buffered and output to the shift register, and then be shifted out from the memory chip to the processor. Fail bit count (FBC) is one of the key parameters to characterize the reliability of a 3D NAND memory device, since high FBC can lead to significant loss of random read performance, which is harmful to the Quality of Service (QoS) of fast storage applications.

A know issue called "temporary read errors" (TRE) refers to the high temporary FBC in the first read, when a 3D NAND memory device recovers from an idle state. TRE can seriously deteriorate the QoS of the 3D NAND Flash memory device. When a 3D NAND array recovers from an idle state, the grain boundary traps (GBTs) discharging during the idle time lead to the low GBTs occupancy, which is responsible for the high temporary FBC in the first read. Therefore, new systems, methods and media to alleviate TRE in 3D NAND memory devices are desired for improving the random read performance and increasing reliability of the 3D NAND flash memory devices.

BRIEF SUMMARY

Embodiments of systems, methods and media of optimization of temporary read errors (TRE) in 3D NAND memory devices are described in the present disclosure.

One aspect provides a memory device, comprising: a plurality of memory cells arranged as an array of NAND memory strings; a plurality of word lines couple to the memory cells; and a controller configured to: determine whether a next read operation is a first read operation of the memory device after recovering from an idle state, and in response to a positive result of the determination, control the memory device to perform an extended pre-phase of the first read operation before a read-phase of the first read operation.

In some embodiments, the extended pre-phase of the first read operation comprises: ramping up selected word lines from a ground voltage to a read pass voltage; and after a first time period, ramping down the selected word lines from the read pass voltage to the ground voltage.

In some embodiments, the first time period is in a range from about 5 µs to 50 µs.

In some embodiments, the extended pre-phase of the first read operation further comprises: ramping up bottom select gates and top select gates in unselected NAND memory strings from the ground voltage to the read pass voltage; and after the first time period, ramping down the bottom select gates and top select gates in the unselected NAND memory strings the read pass voltage to the ground voltage.

In some embodiments, the controller is further configured to: after the extended pre-phase of the first read operation, control the memory device to perform a read-phase and a post-phase of the first read operation, wherein a first time duration of the extended pre-phase of the first read operation is least two times of a second time duration of the post-phase of the first read operation.

In some embodiments, the post-phase of the first read operation comprises: ramping up the selected word lines from the ground voltage to the read pass voltage; and after a second time period, ramping down the selected word lines from the read pass voltage to the ground voltage, wherein the first time period is at least two times of the second time period.

In some embodiments, the controller is further configured to: in response to a negative result of the determination, control the memory device to perform a non-extended pre-phase, a read-phase, and a post phase of a non-first read operation, wherein a first time duration of the extended pre-phase of the first read operation is least two times of a third time duration of the non-extended pre-phase of the non-first read operation.

In some embodiments, the non-extended pre-phase of the non-first read operation comprises: ramping up the selected word lines from the ground voltage to the read pass voltage; and after a third time period, ramping down the selected word lines from the read pass voltage to the ground voltage, wherein the first time period is at least two times of the third time period.

Another aspect of the present disclosure provides a method of performing read operations of a memory device, comprising: determining whether a next read operation is a first read operation of the memory device after recovering from an idle state; and in response to a positive result of the determination, performing an extended pre-phase of the first read operation before a read-phase of the first read operation.

In some embodiments, performing the extended pre-phase of the first read operation comprises: ramping up selected word lines from a ground voltage to a read pass voltage; and after a first time period, ramping down the selected word lines from the read pass voltage to the ground voltage.

In some embodiments, performing the extended pre-phase of the first read operation further comprises: ramping up bottom select gates and top select gates in unselected NAND memory strings from the ground voltage to the read pass voltage; and after the first time period, ramping down the bottom select gates and top select gates in the unselected NAND memory strings the read pass voltage to the ground voltage.

In some embodiments, the method further comprises: after the extended pre-phase of the first read operation, performing a read-phase and a post-phase of the first read operation, wherein a first time duration of the extended pre-phase of the first read operation is least two times of a second time duration of the post-phase of the first read operation.

In some embodiments, performing the post-phase of the first read operation comprises: ramping up the selected word lines from the ground voltage to the read pass voltage; and after a second time period, ramping down the selected word lines from the read pass voltage to the ground voltage, wherein the first time period is at least two times of the second time period.

In some embodiments, the method further comprises: in response to a negative result of the determination, performing a non-extended pre-phase, a read-phase, and a post phase of a non-first read operation, wherein a first time duration of the extended pre-phase of the first read operation is least two times of a third time duration of the non-extended pre-phase of the non-first read operation.

In some embodiments, performing the non-extended pre-phase of the non-first read operation comprises: ramping up the selected word lines from the ground voltage to the read pass voltage; and after a third time period, ramping down the selected word lines from the read pass voltage to the ground voltage, wherein the first time period is at least two times of the third time period.

Yet another aspect of the present disclosure provides a non-transitory medium having instructions stored thereon that, upon execution by at least one controller, cause the at least one controller to perform a method of performing read operations of a memory device. The method comprising: determining whether a next read operation is a first read operation of the memory device after recovering from an idle state; and in response to a positive result of the determination, performing an extended pre-phase of the first read operation before a read-phase of the first read operation.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
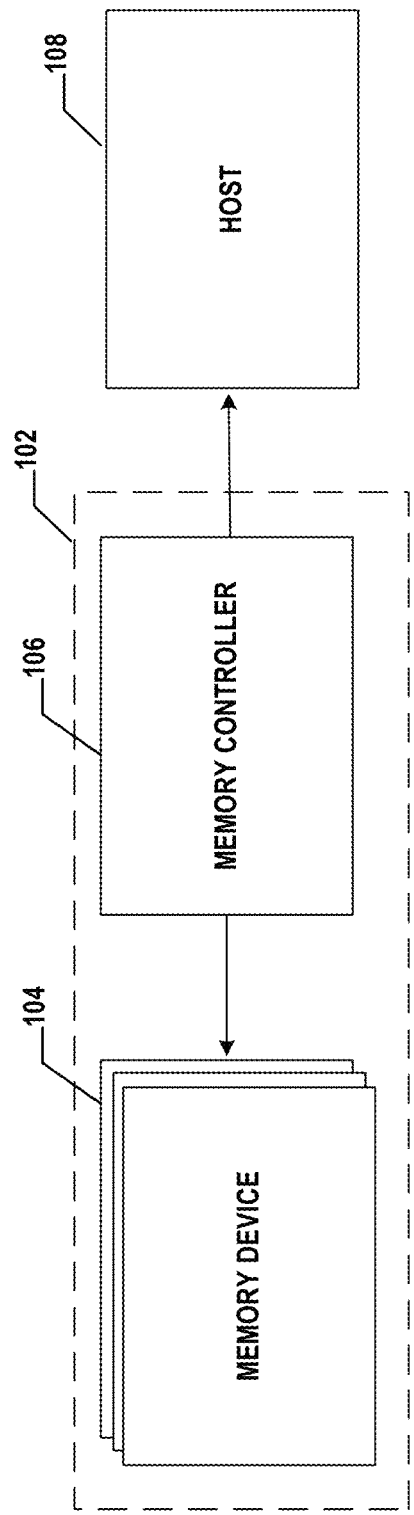
FIG. 1A illustrates a block diagram of an exemplary system having a memory device, in accordance with some embodiments.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The front surface of the substrate is typically where a semiconductor device is formed, and therefore the semiconductor device is formed at a top side of the substrate unless stated otherwise. The bottom surface is opposite to the front surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

As described in the background, fail bit count (FBC) is one of the key parameters to characterize the reliability of a 3D NAND memory device, since high FBC can lead to significant loss of random read performance, which is harmful to the Quality of Service (QoS) of fast storage applications. Temporary read errors (TRE) refers to abnormal high FBC that typically occurs only in the first read operation exiting from an idle state. This is due to the changes of the channel voltages and electronic conditions before and after switching power. Such abnormal high FBC almost always recovers rapidly in the subsequent 2nd and 3rd read operations. Higher raw bit error rate caused by TRE is more likely to lead to a default read failure, and increase the soft-decoding trigger rate, which will severely reduce read performance and deteriorate the QoS of 3D NAND Flash memory device. In the traditional methods, a virtual read operation is added in front of the real read operation sequences to avoid TRE. The disclosed systems, methods and media can alleviate TRE without using virtual read operation for improving the random read performance and increasing reliability of 3D NAND memory devices.

FIG. 1A illustrates a block diagram of an exemplary system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1A, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive the data to or from memory devices 104.

Memory device 104 can be any memory devices disclosed herein, such as a NAND Flash memory device. Memory controller 106 is coupled to memory device 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multimedia-cards (eMMCs) used as data storage for mobile devices, such as smartphones, tablets, laptop computers, etc., and enterprise storage arrays.

Memory controller 106 can be configured to control operations of memory device 104, such as read, erase, and program operations. Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, programming memory device 104. Memory controller 106 can communicate with an external device (e.g., host 108) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 1C:
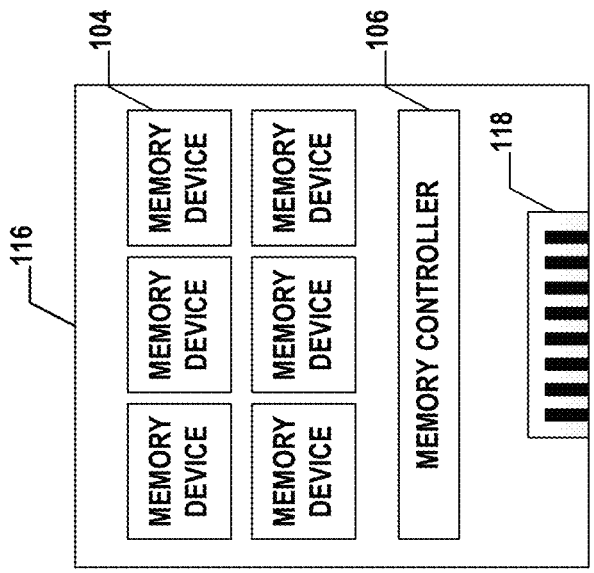
FIG. 1C illustrates a diagram of an exemplary solid-state drive (SSD) having a memory in accordance with some embodiments.
Figure 1B:
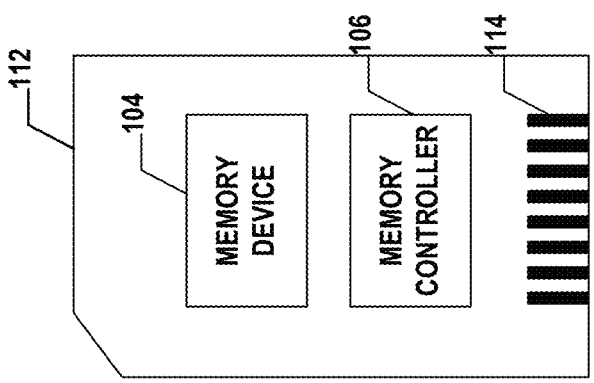
FIG. 1B illustrates a diagram of an exemplary memory card having a memory device, in accordance with some embodiments.

Memory controller 106 and one or more memory devices 104 can be integrated into various types of storage devices, for example, be included in the same package, such as a universal Flash storage (UFS) package or an eMMC package. That is, memory system 102 can be implemented and packaged into different types of end electronic products. In one example as shown in FIG. 1B, memory controller 106 and a single memory device 104 may be integrated into a memory card 112. Memory card 112 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 112 can further include a memory card connector 114 coupling memory card 112 with a host (e.g., host 108 in FIG. 1A). In another example as shown in FIG. 1C, memory controller 106 and multiple memory devices 104 may be integrated into an SSD 116. SSD 116 can further include an SSD connector 118 coupling SSD 116 with a host (e.g., host 108 in FIG. 1A). In some implementations, the storage capacity and/or the operation speed of SSD 116 is greater than those of memory card 112.

Figure 2:
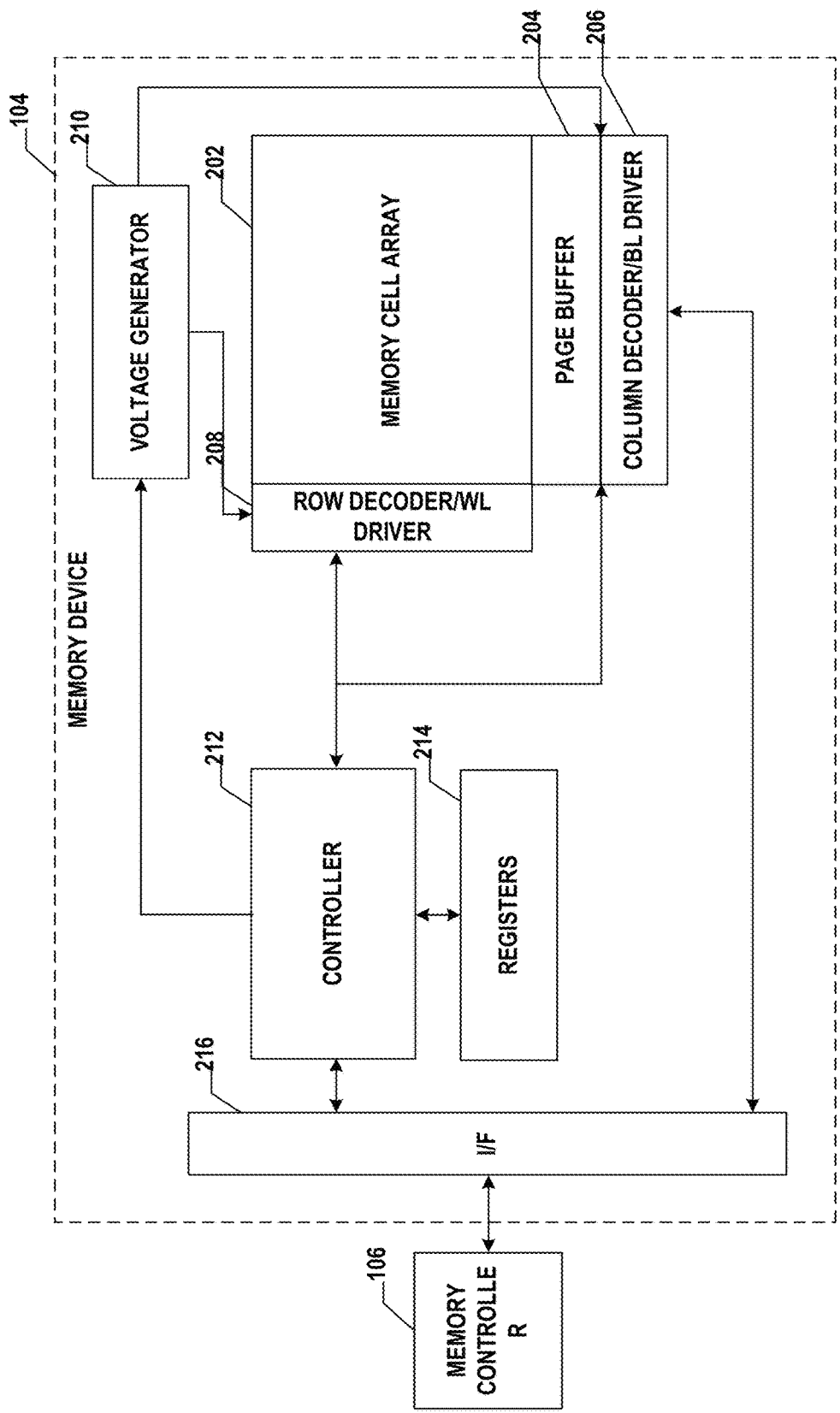
FIG. 2 illustrates a schematic block diagram of an example hardware module configuration of a memory system, in accordance with some embodiments.
Figure 3:
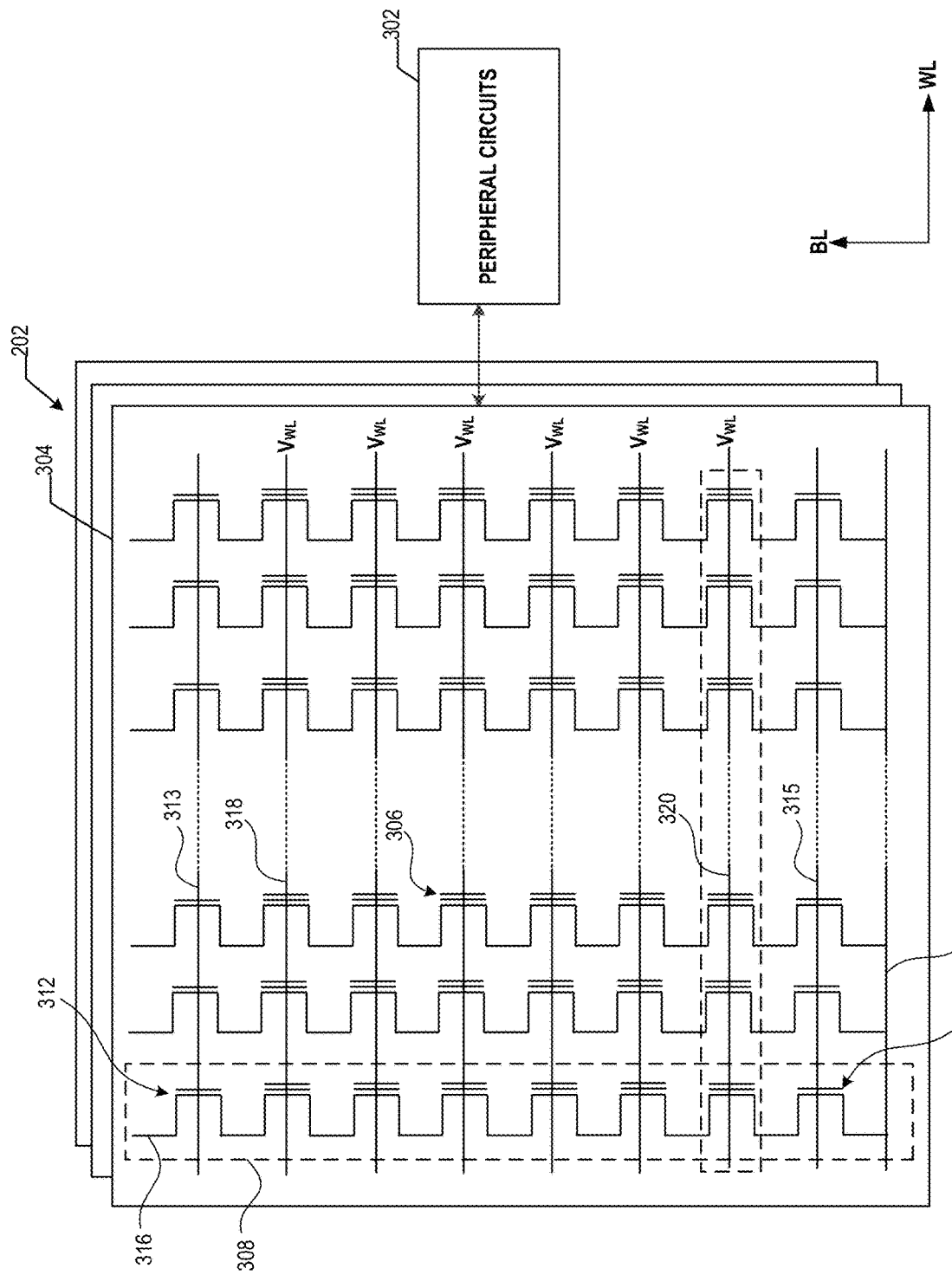
FIG. 3 illustrates a schematic circuit diagram of an exemplary memory device including peripheral circuits, according to some aspects of the present disclosure.

FIG. 2 illustrates a diagram of an exemplary memory device 104, e.g., a NAND Flash memory, having a memory cell array 202 and peripheral circuits including a page buffer 204, a column decoder/bit line driver 206, a row decoder/word line driver 208, a voltage generator 210, controller 212, registers 214, and an interface 216. FIG. 3 illustrates a schematic circuit diagram of an exemplary memory device 104 including a memory cell array 202 and peripheral circuits 302 coupled to memory cell array 202, according to an exemplary aspect.

For ease of illustration, some components in FIGS. 2 and 3 are described together. Peripheral circuits 302 can include page buffer 204, column decoder/bit line driver 206, row decoder/word line driver 208, voltage generator 210, controller 212, registers 214, and interface 216 in FIG. 2. It is understood that in some examples, additional peripheral circuits may be included as well.

In some embodiments, the voltage generator 210 can include a plurality of charge pumps and linear regulators. In some embodiments, the memory cell array can include multiple planes. A plane includes multiple memory cells which may be grouped into memory blocks. A memory block is typically the smallest erasable entity in a NAND flash die. In one example, a memory block includes a number of cells that are coupled to the same bit line. A memory block includes one or multiple pages of cells. The size of the page can vary depending on implementation. In one example, a page has a size of 16 kB. Page sizes of less or more than 16 kB are also possible (e.g., 512 B, 2 kB, 4 kB, etc.).

In some embodiments, the controller 212 can be configured to control voltage generator 210, row decoder/word line driver 208, and column decoder/bit line driver 206 to perform memory operations (e.g., write, read, suspend, etc.) on memory cell array 202. In some embodiments, controller 212 can include a state machine (not shown) configured to provide chip-level control of memory operations, an on-chip address decoder (not shown) configured to provide an address interface between that used by the host 108 or the memory controller 106 to the hardware address used by row decoder/word line driver 208 and column decoder/bit line driver 206, and/or a power control (not shown) configured to control the voltage generator 210 to supply power and voltages supplied to word lines and bit lines during each memory operation.

As shown in FIG. 3, memory cell array 202 can be a NAND Flash memory cell array in which memory cells 306 are provided in the form of an array of NAND memory strings 308 (also referred as "channels") each extending vertically above a substrate (not shown). In some implementations, each NAND memory string 308 includes a plurality of memory cells 306 coupled in series and stacked vertically. Each memory cell 306 can hold a continuous, analog value, such as an electrical voltage or charge, that depends on the number of electrons trapped within a region of memory cell 306. Each memory cell 306 can be either a floating gate type of memory cell including a floating-gate transistor or a charge trap type of memory cell including a charge-trap transistor. In one example, the memory cell 306 includes a transistor with a replacement gate. A memory cell 306 with a replacement gate typically has a low resistance gate (e.g., a tungsten gate) and a charge trap layer between the gate and the channel where charge is trapped or stored to represent one or more bit values. In another example, a memory cell 306 can include a transistor with a floating gate (e.g., a high resistance poly gate) that stores charge indicative of one or more bit values. Other architectures are also possible.

In some implementations, each memory cell 306 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 306 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 3, each NAND memory string 308 can include a bottom select gate (BSG) 310 at its source end and a top select gate (TSG) 312 at its drain end. In some embodiments, the BSG 310 can be a source select gate (SSG), and the TSG 312 can be a drain select gate (DSG). BSG 310 and TSG 312 are respective the gate electrodes of an SSG transistor and a DSG transistor and can be configured to activate selected NAND memory strings 308 (columns of the array or channels) during read and program operations. In some implementations, BSGs 310 of NAND memory strings 308 in the same block 304 are coupled through a same source line (SL) 314, e.g., an array common source (ACS), for example, to the ground. TSG 312 of each NAND memory string 308 is coupled to a respective bit line 316 from which data can be read via an output bus (not shown), according to some implementations. In some implementations, each NAND memory string 308 is configured to be selected or deselected by applying a select voltage (e.g., above the threshold voltage of the transistor having TSG 312) or a deselect voltage (e.g., 0 V) to respective TSG 312 through one or more TSG lines 313 and/or by applying a select voltage (e.g., above the threshold voltage of the transistor having BSG 310) or a deselect voltage (e.g., 0 V) to respective BSG 310 through one or more BSG lines 315.

As shown in FIG. 3, NAND memory strings 308 can be organized into multiple blocks 304, each of which can have a common source line 314. In some implementations, each block 304 is the basic data unit for erase operations, i.e., all memory cells 306 on the same block 304 are erased at the same time. Memory cells 306 of adjacent NAND memory strings 308 can be coupled through word lines 318 that select which row of memory cells 306 is affected by read and program operations. In some implementations, each word line 318 is coupled to a page 320 of memory cells 306, which is the basic data unit for program operations. The size of one page 320 in bits can correspond to the number of NAND memory strings 308 coupled by word line 318 in one block 304. Each word line 318 can include a plurality of control gates (gate electrodes) at each memory cell 306 in respective page 320 and a gate line coupling the control gates. In some cases, dummy word lines, which contain no user data, can also be used in the memory array adjacent to the select gate transistors. Such dummy word lines can shield the edge data word line from certain edge effects.

Peripheral circuits 302 can be coupled to memory cell array 202 through bit lines 316, word lines 318, source lines 314, SSG lines 315, and DSG lines 313. Peripheral circuits 302 may apply voltages on bit lines 316, word lines 318, source lines 314, SSG lines 315, and DSG lines 313 to perform various operations of memory cell array 202. As described above, peripheral circuits 302 can include any suitable circuits for facilitating the operations of memory cell array 202 by applying and sensing voltage signals and/or current signals through bit lines 316 to and from each target memory cell 306 through word lines 318, source lines 314, SSG lines 315, and DSG lines 313. Peripheral circuits 302 can include various types of peripheral circuits formed using MOS technologies.

A programming sequence for a group of memory cells 306 can include programming of all of the intended pages into the group of memory cells 306. A programming sequence can include one or more programming passes. A programming pass (which can include one or more programming loops) can program one or more pages. A programming pass can include the application of one or more effective program voltages to cells to be programmed followed by the application of one or more verify voltages to these cells in order to determine which cells have finished programming (subsequent programming passes generally will not apply an effective program voltage and/or a verify voltage to the cells that have finished programming). The application of an effective program voltage to a cell can include changing the voltage difference between a control gate and a channel of the cell in order to change the threshold voltage of the cell. Accordingly, a voltage of a word line (coupled to the control gate of the target cell) and/or a channel of the cell can be set in order to effectuate application of an effective program voltage. As a program voltage is commonly used to refer to a voltage applied to a word line, the effective program voltage can be the voltage difference between a control gate and channel of a cell (which in instances where the channel is held at 0V can be synonymous with a program voltage).

Figure 4:
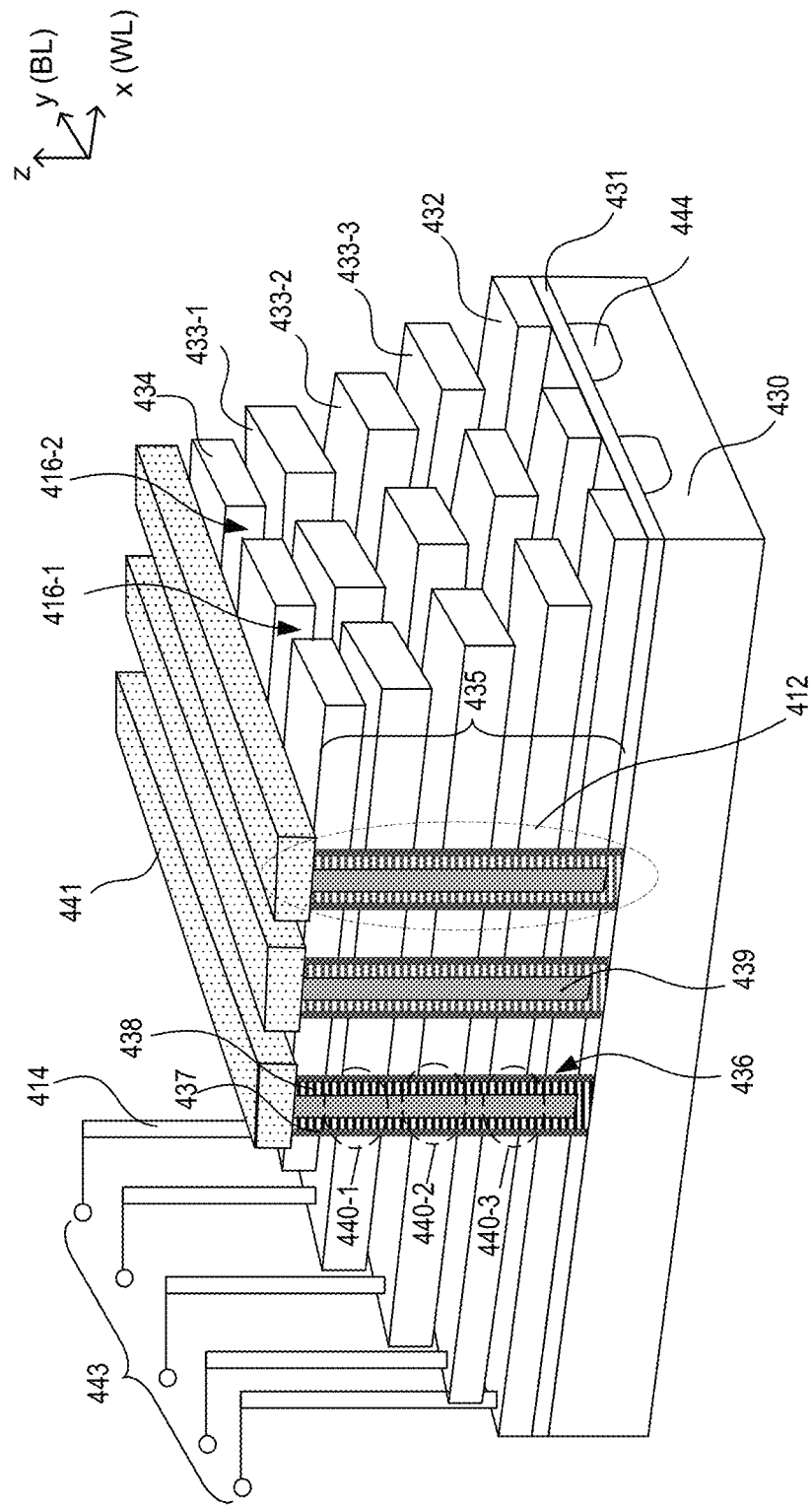
FIG. 4 illustrates a perspective view of a portion of an exemplary three-dimensional (3D) memory array structure, in accordance with some embodiments.

FIG. 4 illustrates a perspective view of a portion of an exemplary three-dimensional (3D) memory cell array structure 400, according to some embodiments. The memory cell array structure 400 includes a substrate 430, an insulating film 431 over the substrate 430, a tier of bottom select gates (BSGs) 432 over the insulating film 431, and a plurality of tiers of control gates 433, also referred to as "word lines" (WLs) stacking on top of the BSGs 432 to form a film stack 435 of alternating conductive and dielectric layers. The dielectric layers adjacent to the tiers of control gates are not shown in FIG. 4 for clarity.

The control gates of each tier are separated by slit structures 416-1 and 416-2 through the film stack 435. The memory cell array structure 400 also includes a tier of top select gates (TSGs) 434 over the stack of control gates 433. The stack of TSGs 434, control gates 433 and BSGs 432 is also referred to as "gate electrodes." The memory cell array structure 400 further includes memory strings 412 and doped source line regions 444 in portions of substrate 430 between adjacent BSGs 432. Each memory strings 412 includes a channel hole 436 extending through the insulating film 431 and the film stack 435 of alternating conductive and dielectric layers. Memory strings 412 also includes a memory film 437 on a sidewall of the channel hole 436, a channel layer 438 over the memory film 437, and a core filling film 439 surrounded by the channel layer 438. A memory cell 440 can be formed at the intersection of the control gate 433 and the memory string 412. A portion of the channel layer 438 underneath the control gate 433 is also referred to as the channel of the memory cell 440. The memory cell array structure 400 further includes a plurality of bit lines (BLs) 441 connected with the memory strings 412 over the TSGs 434. The memory cell array structure 400 also includes a plurality of metal interconnect lines 443 connected with the gate electrodes through a plurality of contact structures 414. The edge of the film stack 435 is configured in a shape of staircase to allow an electrical connection to each tier of the gate electrodes.

In FIG. 4, for illustrative purposes, three tiers of control gates 433-1, 433-2, and 433-3 are shown together with one tier of TSG 434 and one tier of BSG 432. In this example, each memory string 412 can include three memory cells 440-1, 440-2 and 440-3, corresponding to the control gates 433-1, 433-2 and 433-3, respectively. The number of control gates and the number of memory cells can be more than three to increase storage capacity. The memory cell array structure 400 can also include other structures, for example, TSG cut structures, common source contacts and dummy memory strings, etc. These structures are not shown in FIG. 4 for simplicity.

Figure 5:
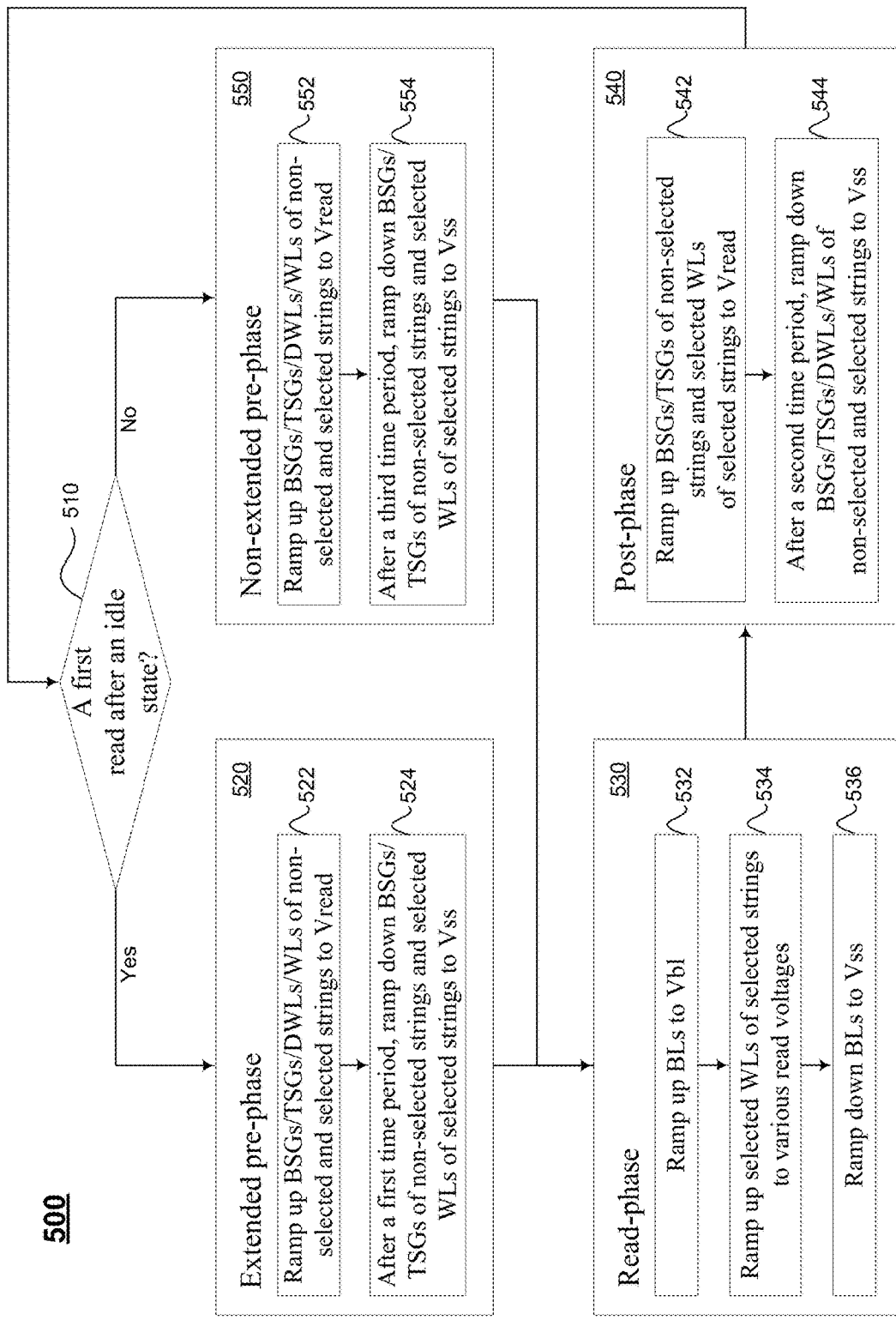
FIG. 5 illustrates a flowchart of an example method of performing channel preparation operation by array source coupling, according to some embodiments.
Figure 6A:
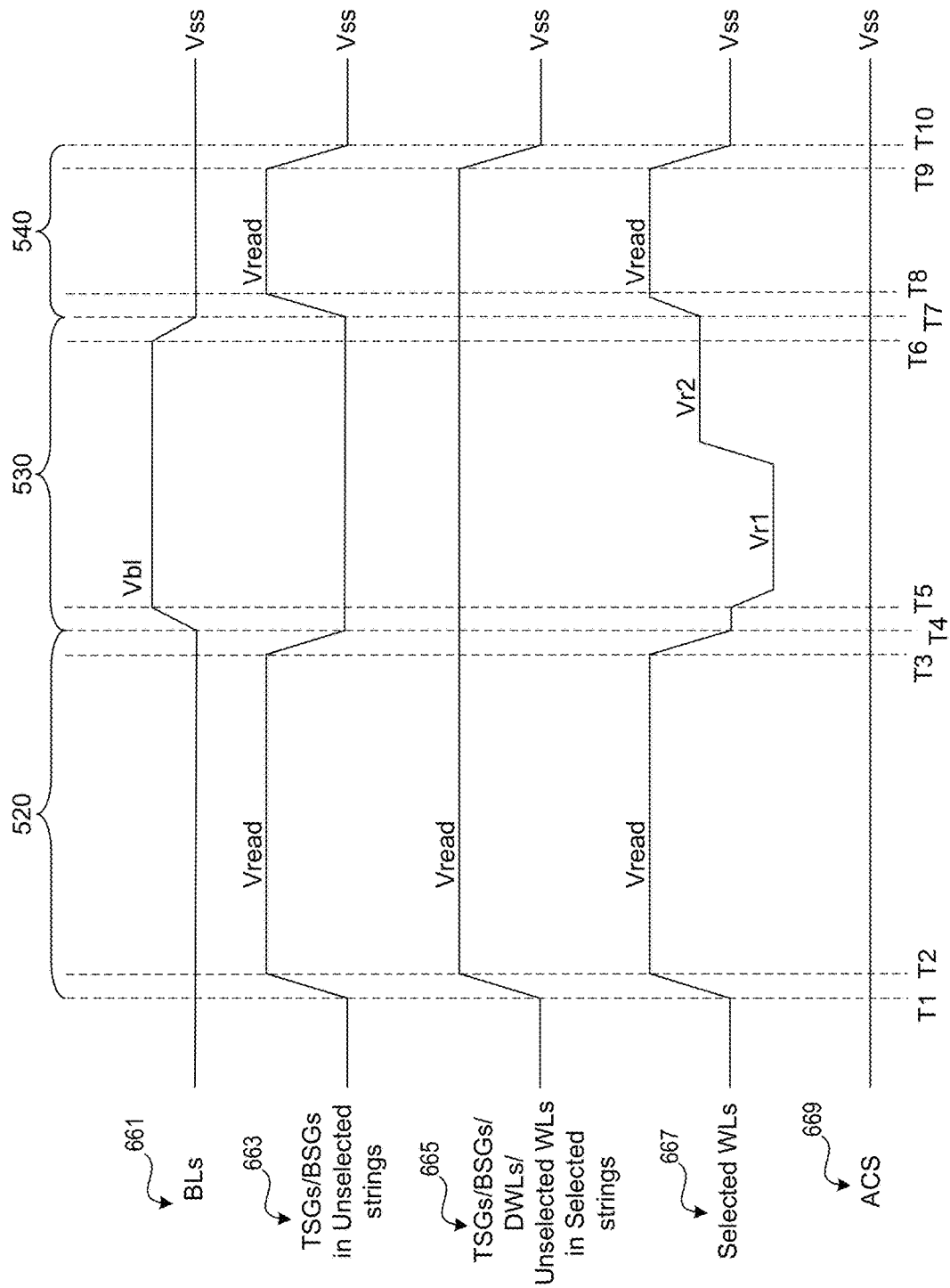
FIGS. 6A and 6B illustrate schematic diagrams illustrating voltage changing of various wires in the circuit during various phases of the channel preparation operation of FIG. 5, according to some embodiments.
Figure 6B:
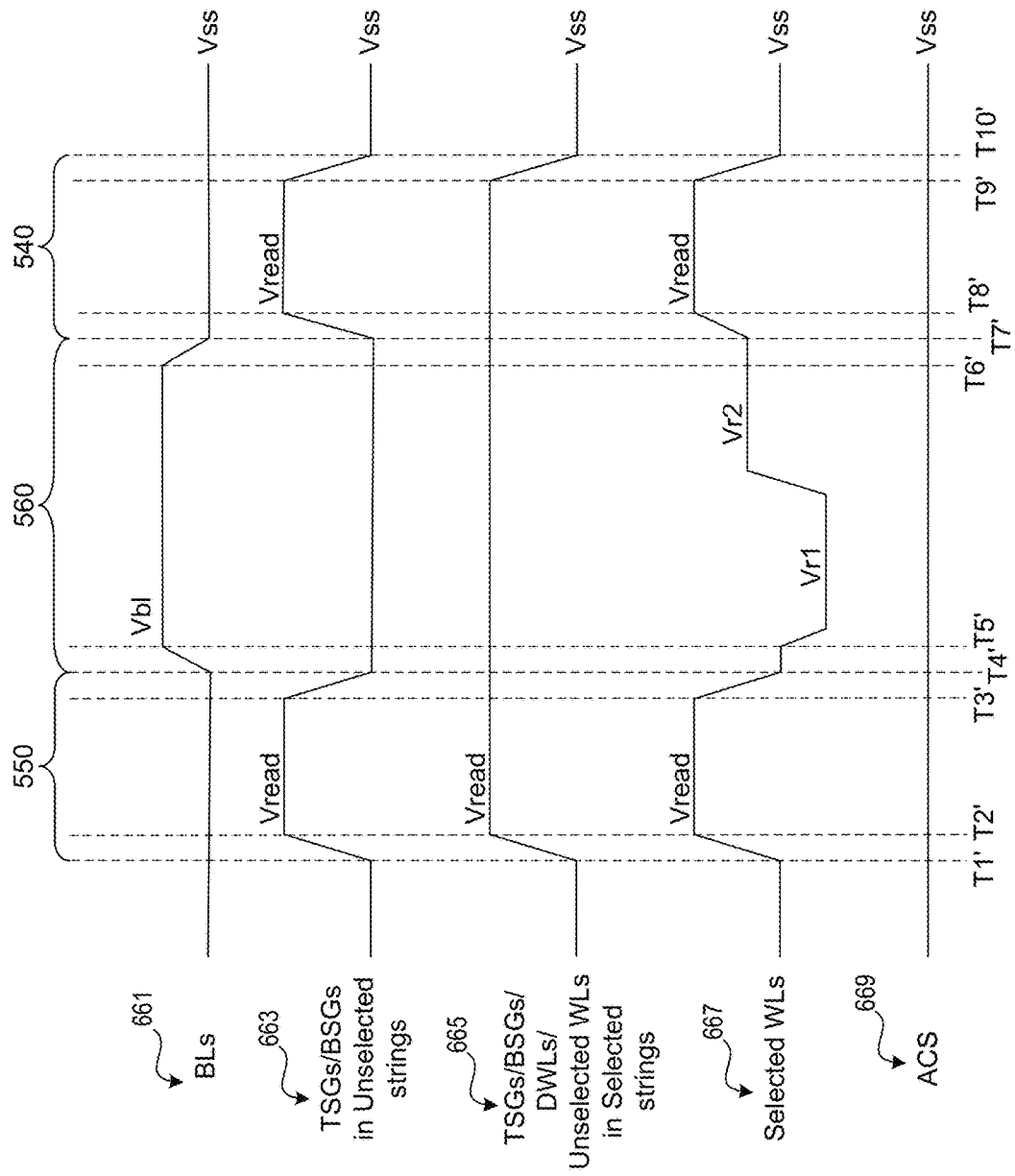

FIG. 5 illustrates a flowchart of an example method of performing read operations for optimization of temporary read errors (TRE) in a 3D NAND memory device, according to some embodiments. FIGS. 6A and 6B illustrate schematic diagrams illustrating voltage changing of various wires in the circuit during various phases of the read operations in connection with FIG. 5, according to some embodiments.

Referring to FIG. 5, method 500 starts at operation 510, in which it is determined whether a next read operation is a first read operation after an idle state. For example, the controller 212 of the memory device 104 as shown in FIG. 2 can determine if the memory device 104 is just recovered from an idle state, and the next read operation is a first read operation after recovering from the idle state.

In response to determining that the next read operation is a first read operation after recovering from the idle state ("Yes" at operation 510), method 500 can proceed to an extended pre-phase 520 of the first time read operation. As shown in FIG. 6A, the extended pre-phase 520 of the first time read operation begins at time T1 and ends at time T4. The pre-phase (also referred as "pre-read phase") can be used to prepare the memory cells to be sensed, but the memory cells are not sensed until the read phase (also referred as "sense phase"). It is noted that the memory cells to be sensed are referred to herein as "selected memory cells" and a word line that is connected to the selected memory cells is referred to herein as the "selected word line (selected WL)." During the pre-phase a voltage is applied to the selected WL. Voltages may also be applied to other WLs during the pre-phase. In some embodiments, the pre-phase is used to discharge channels of NAND strings prior to the read phase.

Before time T1, the initial states of all wires are set at the ground voltage. That is, the bit lines (BLs) 661, the top select gates (TSGs) and the bottom select gates (BSGs) in the unselected strings 663, the TSGs, BSGs, dummy word lines (DWLs) and unselected word lines in the selected strings 665, the selected word lines 667, and the array common source (ACS) 669 are all set at Vss (i.e., 0V).

Referring to FIGS. 5 and 6A, in the period from time T1 to time T2, the extended pre-phase 520 of first time read operation can include operation 522, in which the TSGs and BSGs in the unselected strings 663, the TSGs, BSGs, DWLs and unselected WLs in the selected strings 665, and the selected WLs 667 can be ramped up to a read pass voltage (e.g., Vread). In some embodiments, the read pass voltage Vread can be a high voltage to place the unselected memory cells in a strongly conductive state, to avoid interfering with the sensing of the selected memory cells in the subsequent read-phase. In some embodiments, the period from time T1 to time T2 can be in a range from about 3 µs to about 10 µs.

Referring to FIG. 5, the extended pre-phase 520 of first time read operation can include operation 524, in which the BSGs/TSGs of non-selected strings and selected WLs of selected strings can be ramped down to Vss after a first time period.

As shown in FIG. 6A, in the first time period from time T2 to time T3, the TSGs and BSGs in the unselected strings 663, the TSGs, BSGs, DWLs and unselected WLs in the selected strings 665, and the selected WLs 667 can keep the read pass voltage Vread. In some embodiments, the first time period from time T2 to time T3 can be in a range from about 10 µs to about 50 µs.

In the period from the time T3 to time T4, the TSGs and BSGs in the unselected strings 663, and the selected WLs 667 can be ramped down from Vread to Vss. In some embodiments, the period from time T3 to time T4 can be in a range from about 3 µs to about 10 µs. During the period from time T3 to time T4, the TSGs, BSGs, DWLs and unselected WLs in the selected strings 665 can be kept as Vread. In the entire pre-phase from time T1 to time T4, the bit lines (BLs) 661 and the array common source (ACS) 669 can be kept as Vss.

Referring to FIG. 5, the method 500 can then proceed to read-phase 530. As shown in FIG. 6A, the read-phase 530 begins at time T4 and ends at time T7. In some embodiment, the read-phase can also be referred as a sense phase, in which one or more read compare voltages are applied to the selected word line. Read pass voltages (e.g., Vread) are applied to the unselected word lines during the read-phase.

Referring to FIGS. 5 and 6A, in the period from time T4 to time T5, the read-phase 530 can include operation 532, in which the BLs 661 can be ramped up from Vss to a bit line voltage, i.e., Vbl. In some embodiments, the period from time T4 to time T5 can be in a range from about 3 µs to about 10 µs. During the period from time T4 to time T5, the TSGs and BSGs in the unselected strings 663, the TSGs, BSGs, DWLs and unselected WLs in the selected strings 665, the selected WLs 667 and the array common source (ACS) 669 can be kept at the ground voltage Vss.

In the period from the time T5 to time T6, the read-phase 530 can include operation 534, in which the selected WLs 667 of the selected strings can be ramped to various read voltages. As shown in FIG. 6A, two read voltages Vr1 and Vr2 are illustrated as an example. However, more than two (e.g., 3, 4, 5, 6, 7, etc.) read voltages can be used for reading the states of the memory cells in the read operation. In some embodiments, the read voltages can be set at levels which are expected to be between the threshold voltage levels of adjacent data states.

During the period from the time T5 to time T6, the TSGs, BSGs, DWLs and unselected WLs in the selected strings 665 can be kept at the read pass voltage Vread. The voltages of the unselected word lines are set to Vread which is high enough to place the unselected memory cells in a strongly conductive state, to avoid interfering with the sensing of the selected memory cells. Further, during the period from the time T5 to time T6, the BLs 661 are kept at the bit line voltage Vbl, the TSGs and BSGs in the unselected strings 663 and the array common source (ACS) 669 can be kept as Vss.

Referring to FIGS. 5 and 6A, in the period from time T6 to time T7, the read-phase 530 can include operation 536, in which the BLs 661 can be ramped down from the bit line voltage Vbl to the ground voltage Vss.

The method 500 can then proceed to post-phase 540. As shown in FIG. 6A, the post-phase 540 begins at time T7 and ends at time T10. In some embodiment, the post-phase (also referred as "post-read phase") is used to discharge channels of NAND strings after the read phase.

Referring to FIGS. 5 and 6A, in the period from time T7 to time T8, the post-phase 540 can include operation 542, in which the TSGs and BSGs in the unselected strings 663, the TSGs, BSGs, DWLs and unselected WLs in the selected strings 665, and the selected WLs 667 can be ramped up to the read pass voltage Vread. In some embodiments, the period from time T7 to time T8 can be in a range from about 3 µs to about 10 µs.

Referring to FIG. 5, the post-phase 540 can include operation 544, in which the BSGs/TSGs of non-selected strings and selected WLs of selected strings can be ramped down to Vss after a second time period.

As shown in FIG. 6A, in the second time period from time T8 to time T9, the TSGs and BSGs in the unselected strings 663, the TSGs, BSGs, DWLs and unselected WLs in the selected strings 665, and the selected WLs 667 can keep the read pass voltage Vread. In some embodiments, the second time period from time T8 to time T9 can be in a range from about 5 μs to about 10 μs. That is, the first time period from time T2 to time T3 can be about 2 times to 5 times of the second time period from time T8 to time T9.

In the period from the time T9 to time T10, the TSGs and BSGs in the unselected strings 663, the TSGs, BSGs, DWLs and unselected WLs in the selected strings 665, and the selected WLs 667 can be ramped down from Vread to Vss. In some embodiments, the period from time T9 to time T10 can be in a range from about 3 μs to about 10 μs. In the entire pre-phase from time T1 to time T4, the bit lines (BLs) 661 and the array common source (ACS) 669 can be kept as Vss.

Referring back to FIG. 5, the method 500 can then proceed back to operation 510 to further determined whether a next read operation is a first read operation after an idle state. In response to determining that the next read operation is not a first read operation after recovering from the idle state ("No" at operation 510), method 500 can proceed to non-extended pre-phase 550 of non-first time read operation. As shown in FIG. 6B, the non-extended pre-phase 550 of non-first time read operation begins at time T1' and ends at time T4'.

Referring to FIGS. 5 and 6B, in the period from time T1' to time T2', the non-extended pre-phase 550 of non-first time read operation can include operation 552, in which the TSGs and BSGs in the unselected strings 663, the TSGs, BSGs, DWLs and unselected WLs in the selected strings 665, and the selected WLs 667 can be ramped up to a read pass voltage (e.g., Vread). In some embodiments, the read pass voltage Vread can be a high voltage to place the unselected memory cells in a strongly conductive state, to avoid interfering with the sensing of the selected memory cells in the subsequent read-phase. In some embodiments, the period from time T1' to time T2' can be in a range from about 3 μs to about 10 μs.

Referring to FIG. 5, the non-extended pre-phase 550 of non-first time read operation can include operation 554, in which the BSGs/TSGs of non-selected strings and selected WLs of selected strings can be ramped down to Vss after a third time period.

As shown in FIG. 6B, in the third time period from time T2' to time T3', the TSGs and BSGs in the unselected strings 663, the TSGs, BSGs, DWLs and unselected WLs in the selected strings 665, and the selected WLs 667 can keep the read pass voltage Vread. In some embodiments, the third time period from time T2' to time T3' can be in a range from about 5 μs to about 10 μs. That it, the first time period from time T2 to time T3 can be about 2 times to 5 times of the third time period from time T2' to time T3'

In the period from the time T3' to time T4', the TSGs and BSGs in the unselected strings 663, and the selected WLs 667 can be ramped down from Vread to Vss. In some embodiments, the period from time T3' to time T4' can be in a range from about 3 μs to about 10 μs. During the period from time T3' to time T4', the TSGs, BSGs, DWLs and unselected WLs in the selected strings 665 can be kept as Vread. In the entire pre-phase from time T1' to time T4', the bit lines (BLs) 661 and the array common source (ACS) 669 can be kept as Vss.

Referring to FIG. 5, the method 500 can then proceed to read-phase 530 and post-phase 540 as described above to finish the non-first time read operation.

In the disclosed method, a virtual read phase in the traditional method for the first time read operation after recovering from an idle state is combined with the pre-pulse of the second time read operation. That is, when it is detected that the power of memory system is turned on after a power-off state, the pre-phase of the first time read operation is extended to act as a virtual read phase. In some embodiments, a first time duration of an extended pre-phase of the first time read operation can be at least two times of a second time duration of a post-phase of the first time read operation, and can be at least two times of a third time duration of a non-extended pre-phase of a non-first time read operation. For example, an extended pre-phase of the first time read operation can be in a ranged from about 20 μs to about 70 μs, while a post-phase of the first time read operation and a non-extended pre-phase of a non-first time read operation can be in a ranged from about 10 μs to about 30 μs. As such, without using a virtual read operation before the first time read operation, the time cost for the virtual read phase can be saved, and the read result of the first read operation after idle can be obtained more quickly while the random read performance and reliability of the memory device are still preserved.

It should be noted that the above steps in each phase of the flow diagram of FIG. 5 can be executed or performed by controller 212 in connection of the FIG. 2 in any order or sequence not limited to the order and sequence shown and described in the figures. Also, some of the above steps in each phase of the flow diagram of FIG. 5 can be executed or performed substantially simultaneously where appropriate or in parallel to reduce latency and processing times. Furthermore, it should be noted that FIG. 5 is provided as an example only. At least some of the steps shown in the figure may be performed in a different order than represented, performed concurrently, or altogether omitted. In some embodiments, the operations of the disclosed method 500 can be directly executed by the controller 212 of a NAND flash memory device as described above in connection with FIG. 2, and combined with a corresponding software module resided in registers 214.

Accordingly, method, systems, and media are disclosed for alleviating TRE without using virtual read operation, thereby increasing random read speed, improving the random read performance, and increasing reliability of 3D NAND memory devices.

One aspect of the present disclosure provides a memory device, comprising: a plurality of memory cells arranged as an array of NAND memory strings; a plurality of word lines couple to the memory cells; and a controller configured to: determine whether a next read operation is a first read operation of the memory device after recovering from an idle state, and In response to a positive result of the determination, control the memory device to perform an extended pre-phase of the first read operation before a read-phase of the first read operation.

In some embodiments, the extended pre-phase of the first read operation comprises: ramping up selected word lines from a ground voltage to a read pass voltage; and after a first time period, ramping down the selected word lines from the read pass voltage to the ground voltage.

In some embodiments, the first time period is in a range from about 5 μs to 50 μs.

In some embodiments, the extended pre-phase of the first read operation further comprises: ramping up bottom select gates and top select gates in unselected NAND memory strings from the ground voltage to the read pass voltage; and after the first time period, ramping down the bottom select gates and top select gates in the unselected NAND memory strings the read pass voltage to the ground voltage.

In some embodiments, the controller is further configured to: after the extended pre-phase of the first read operation, control the memory device to perform a read-phase and a post-phase of the first read operation, wherein a first time duration of the extended pre-phase of the first read operation is least two times of a second time duration of the post-phase of the first read operation.

In some embodiments, the post-phase of the first read operation comprises: ramping up the selected word lines from the ground voltage to the read pass voltage; and after a second time period, ramping down the selected word lines from the read pass voltage to the ground voltage, wherein the first time period is at least two times of the second time period.

In some embodiments, the controller is further configured to: in response to a negative result of the determination, control the memory device to perform a non-extended pre-phase, a read-phase, and a post phase of a non-first read operation, wherein a first time duration of the extended pre-phase of the first read operation is least two times of a third time duration of the non-extended pre-phase of the non-first read operation.

In some embodiments, the non-extended pre-phase of the non-first read operation comprises: ramping up the selected word lines from the ground voltage to the read pass voltage; and after a third time period, ramping down the selected word lines from the read pass voltage to the ground voltage, wherein the first time period is at least two times of the third time period.

Another aspect of the present disclosure provides a method of performing read operations of a memory device, comprising: determining whether a next read operation is a first read operation of the memory device after recovering from an idle state; and in response to a positive result of the determination, performing an extended pre-phase of the first read operation before a read-phase of the first read operation.

In some embodiments, performing the extended pre-phase of the first read operation comprises: ramping up selected word lines from a ground voltage to a read pass voltage; and after a first time period, ramping down the selected word lines from the read pass voltage to the ground voltage.

In some embodiments, performing the extended pre-phase of the first read operation further comprises: ramping up bottom select gates and top select gates in unselected NAND memory strings from the ground voltage to the read pass voltage; and after the first time period, ramping down the bottom select gates and top select gates in the unselected NAND memory strings the read pass voltage to the ground voltage.

In some embodiments, the method further comprises: after the extended pre-phase of the first read operation, performing a read-phase and a post-phase of the first read operation, wherein a first time duration of the extended pre-phase of the first read operation is least two times of a second time duration of the post-phase of the first read operation.

In some embodiments, performing the post-phase of the first read operation comprises: ramping up the selected word lines from the ground voltage to the read pass voltage; and after a second time period, ramping down the selected word lines from the read pass voltage to the ground voltage, wherein the first time period is at least two times of the second time period.

In some embodiments, the method further comprises: in response to a negative result of the determination, performing a non-extended pre-phase, a read-phase, and a post phase of a non-first read operation, wherein a first time duration of the extended pre-phase of the first read operation is least two times of a third time duration of the non-extended pre-phase of the non-first read operation.

In some embodiments, performing the non-extended pre-phase of the non-first read operation comprises: ramping up the selected word lines from the ground voltage to the read pass voltage; and after a third time period, ramping down the selected word lines from the read pass voltage to the ground voltage, wherein the first time period is at least two times of the third time period.

Yet another aspect of the present disclosure provides a non-transitory medium having instructions stored thereon that, upon execution by at least one controller, cause the at least one controller to perform a method of performing read operations of a memory device. The method comprising: determining whether a next read operation is a first read operation of the memory device after recovering from an idle state; and in response to a positive result of the determination, performing an extended pre-phase of the first read operation before a read-phase of the first read operation.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:
1. A memory device, comprising:
a plurality of memory cells arranged as an array of NAND memory strings;
a plurality of word lines coupled to the memory cells; and
a controller configured to:

determine whether a next read operation is a first read operation of the memory device after recovering from an idle state, and in response to a positive result of the determination, control the memory device to perform an extended pre-phase of the first read operation before a read-phase of the first read operation, wherein the first read operation comprises:

ramping up selected word lines from a ground voltage to a read pass voltage; and after a first time period, ramping down the selected word lines from the read pass voltage to the ground voltage.

2. The memory device of claim 1, wherein the extended pre-phase of the first read operation further comprises:

ramping up bottom select gates and top select gates in unselected NAND memory strings from the ground voltage to the read pass voltage; and after the first time period, ramping down the bottom select gates and top select gates in the unselected NAND memory strings from the read pass voltage to the ground voltage.

3. The memory device of claim 1, wherein the controller is further configured to:

after the extended pre-phase of the first read operation, control the memory device to perform the read-phase and a post-phase of the first read operation, wherein a first time duration of the extended pre-phase of the first read operation is least two times a second time duration of the post-phase of the first read operation.

4. The memory device of claim 3, wherein the post-phase of the first read operation comprises:

ramping up selected word lines from the ground voltage to the read pass voltage; and after a second time period, ramping down the selected word lines from the read pass voltage to the ground voltage, wherein the first time period is at least two times the second time period.

5. The memory device of claim 1, wherein the controller is further configured to:

in response to a negative result of the determination, control the memory device to perform a non-extended pre-phase, a read-phase and a post phase of a non-first read operation, wherein a first time duration of the extended pre-phase of the first read operation is least two times a third time duration of the non-extended pre-phase of the non-first read operation.

6. The memory device of claim 5, wherein the non-extended pre-phase of the non-first read operation comprises:

ramping up the selected word lines from the ground voltage to the read pass voltage; and after a third time period, ramping down the selected word lines from the read pass voltage to the ground voltage, wherein the first time period is at least two times the third time period.

7. The memory device of claim 1, wherein the controller is further configured to apply more than one read voltage to the selected word lines during a read phase of the first read operation.

8. A method of performing read operations of a memory device, comprising:

determining whether a next read operation is a first read operation of the memory device after recovering from an idle state; and in response to a positive result of the determination, performing an extended pre-phase of the first read operation before a read-phase of the first read operation, wherein performing the extended pre-phase of the first read operation comprises:

ramping up selected word lines from a ground voltage to a read pass voltage; and after a first time period, ramping down the selected word lines from the read pass voltage to the ground voltage.

9. The method of claim 8, wherein performing the extended pre-phase of the first read operation further comprises:

ramping up bottom select gates and top select gates in unselected NAND memory strings from the ground voltage to the read pass voltage; and after the first time period, ramping down the bottom select gates and top select gates in the unselected NAND memory strings from the read pass voltage to the ground voltage.

10. The method of claim 8, further comprising:

after the extended pre-phase of the first read operation, performing the read-phase and a post-phase of the first read operation, wherein a first time duration of the extended pre-phase of the first read operation is least two times a second time duration of the post-phase of the first read operation.

11. The method of claim 10, wherein performing the post-phase of the first read operation comprises:

ramping up selected word lines from the ground voltage to the read pass voltage; and after a second time period, ramping down the selected word lines from the read pass voltage to the ground voltage, wherein the first time period is at least two times the second time period.

12. The method of claim 11, further comprising:

in response to a negative result of the determination, performing a non-extended pre-phase, a read-phase and a post phase of a non-first read operation, wherein a first time duration of the extended pre-phase of the first read operation is least two times a third time duration of the non-extended pre-phase of the non-first read operation.

13. The method of claim 12, wherein performing the non-extended pre-phase of the non-first read operation comprises:

ramping up the selected word lines from the ground voltage to the read pass voltage; and after a third time period, ramping down the selected word lines from the read pass voltage to the ground voltage, wherein the first time period is at least two times the third time period.

14. The method of claim 8, further comprising applying more than one read voltage to the selected word lines during a read phase of the first read operation.

15. A non-transitory medium having instructions stored thereon that, upon execution by at least one controller, cause the at least one controller to perform a method of performing read operations of a memory device, the method comprising:

determining whether a next read operation is a first read operation of the memory device after recovering from an idle state; and in response to a positive result of the determination, performing an extended pre-phase of the first read operation before a read-phase of the first read operation, wherein performing the extended pre-phase of the first read operation comprises:
ramping up selected word lines from a ground voltage to a read pass voltage; and
after a first time period, ramping down the selected word lines from the read pass voltage to the ground voltage.

16. The non-transitory medium of claim 15, wherein performing the extended pre-phase of the first read operation further comprises:
ramping up bottom select gates and top select gates in unselected NAND memory strings from the ground voltage to the read pass voltage; and
after the first time period, ramping down the bottom select gates and top select gates in the unselected NAND memory strings from the read pass voltage to the ground voltage.

17. The non-transitory medium of claim 16, wherein the method further comprises:
after the extended pre-phase of the first read operation, performing the read-phase and a post-phase of the first read operation,
wherein a first time duration of the extended pre-phase of the first read operation is least two times a second time duration of the post-phase of the first read operation.

18. The non-transitory medium of claim 17, wherein performing the post-phase of the first read operation comprises:
ramping up the selected word lines from the ground voltage to the read pass voltage; and
after a second time period, ramping down the selected word lines from the read pass voltage to the ground voltage,
wherein the first time period is at least two times the second time period.

19. The non-transitory medium of claim 15, wherein the method further comprises:
in response to a negative result of the determination, performing a non-extended pre-phase, a read-phase and a post phase of a non-first read operation,
wherein a first time duration of the extended pre-phase of the first read operation is least two times a third time duration of the non-extended pre-phase of the non-first read operation.

20. The non-transitory medium of claim 15, wherein performing a read phase of the first read operation comprises applying more than one read voltage to the selected word lines during a read phase of the read operation.

* * * * *